United States Patent
Tan et al.

(10) Patent No.: US 9,613,578 B2
(45) Date of Patent: Apr. 4, 2017

(54) SHIFT REGISTER UNIT, GATE DRIVING CIRCUIT AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Wen Tan, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 56 days.

(21) Appl. No.: 14/422,316

(22) PCT Filed: Aug. 14, 2013

(86) PCT No.: PCT/CN2013/081440
§ 371 (c)(1),
(2) Date: Feb. 18, 2015

(87) PCT Pub. No.: WO2014/205897
PCT Pub. Date: Dec. 31, 2014

(65) Prior Publication Data
US 2015/0248867 A1 Sep. 3, 2015

(30) Foreign Application Priority Data
Jun. 26, 2013 (CN) .......................... 2013 1 0257752

(51) Int. Cl.
*G09G 3/36* (2006.01)
*G11C 19/28* (2006.01)

(52) U.S. Cl.
CPC .......... *G09G 3/3648* (2013.01); *G11C 19/28* (2013.01); *G09G 3/3674* (2013.01); *G09G 2310/0286* (2013.01); *G09G 2310/08* (2013.01)

(58) Field of Classification Search
CPC .... G11C 19/28; G09G 3/3648; G09G 3/3674; G09G 2310/0286; G09G 2310/08
See application file for complete search history.

(56) References Cited

U.S. PATENT DOCUMENTS

| | | |
|---|---|---|
| 6,630,920 B1 | 10/2003 | Maekawa et al. |
| 2004/0066361 A1 | 4/2004 | Ishii et al. |

(Continued)

FOREIGN PATENT DOCUMENTS

| | | |
|---|---|---|
| CN | 1272655 C | 8/2006 |
| CN | 1273951 C | 9/2006 |

(Continued)

OTHER PUBLICATIONS

Chinese Office Action mailed May 18, 2015 regarding Chinese Application No. 201310257752.1. Translation provided by Dragon Intellectual Property Law Firm.

(Continued)

*Primary Examiner* — Premal Patel
(74) *Attorney, Agent, or Firm* — Harness, Dickey & Pierce, P.L.C.

(57) ABSTRACT

The shift register unit according to the present disclosure may include a latch module, and at least two levels of output control modules connected with the latch module. Input ends of the latch module may be connected with a start signal and a clock signal respectively, an output end of the latch module may be connected with input ends of the at least two levels of output control modules, and the latch module may be configured to latch the start signal according (Continued)

to the clock signal inputted. Input ends of the output control modules may be connected with clock signals, the output control modules may be configured to output gate line driving signals according to the clock signals. All the clock signals may be inputted sequentially to the latch module and each level of output control modules in accordance with a timing sequence.

12 Claims, 9 Drawing Sheets

(56) References Cited

U.S. PATENT DOCUMENTS

| | | | | |
|---|---|---|---|---|
| 2009/0303226 | A1* | 12/2009 | Kim | G09G 3/3688 345/213 |
| 2010/0086097 | A1 | 4/2010 | Tseng et al. | |
| 2011/0316833 | A1* | 12/2011 | Chang | G09G 3/3677 345/211 |

FOREIGN PATENT DOCUMENTS

| | | |
|---|---|---|
| CN | 101097682 A | 1/2008 |
| CN | 101114414 A | 1/2008 |
| CN | 101359511 A | 2/2009 |
| CN | 101783107 A | 7/2010 |
| CN | 202196566 U | 4/2012 |
| CN | 102708777 A | 10/2012 |
| CN | 202650488 U | 1/2013 |
| GB | 2459451 A | 10/2009 |
| KR | 20080003065 A | 1/2008 |

OTHER PUBLICATIONS

Third Office Action regarding Chinese application No. 201310257752.1, dated Sep. 6, 2015. Translation provided by Dragon Intellectual Property Law Firm.

International Search Report and Written Opinion mailed Apr. 3, 2014 regarding PCT/CN2013/081440.

Chinese Office Action dated Dec. 22, 2014 regarding Chinese Application No. 2013102577521. Translation provided by Dragon Intellectual Property Law Firm.

* cited by examiner

SHIFT REGISTER UNIT, GATE DRIVING CIRCUIT AND DISPLAY DEVICE

CROSS-REFERENCE TO RELATED APPLICATIONS

This application is the U.S. national phase of PCT Application No. PCT/CN2013/081440 filed on Aug. 14, 2013, which claims priority to Chinese Patent Application No. 201310257752.1 filed on Jun. 26, 2013, the disclosures of which are incorporated in their entirety by reference herein.

TECHNICAL FIELD

The present disclosure relates to the field of display technology, in particular to a shift register unit, a gate driving circuit and a display device.

BACKGROUND

A thin film transistor-liquid crystal display (TFT-LCD) is composed of a matrix of pixels defined by gate lines and data lines which are in horizontal and vertical directions respectively and intersected to each other. When the TFT-LCD displays, each pixel line is gated (selected) sequentially from top to bottom by gate electrodes (Gate) on the gate lines inputting a square wave with a certain width, and inputted with a desired signal sequentially from top to bottom by source electrodes (Source) of the data lines. When the display has a high resolution, outputs of both the gate electrodes and the source electrodes of the display are of a large number, and the length of the driving circuit will also be increased, which will be adverse to the bonding process for the module driving circuit.

To solve the above problem, in the manufacture of conventional displays, a design of Gate Driver on Array (GOA) circuit is often used. Circuits with thin film transistors (TFTs) as switches are integrated in an array substrate of a display panel to form a display panel scan driver, which can leave out a bonding region and a peripheral wiring space so as to achieve symmetry on both sides of the display panel and an aesthetic design of having a narrow border.

In a conventional GOA circuit design, as shown in FIG. 1 which shows a structure of a shift register unit of a typical GOA circuit, it can be seen that, the shift register unit generally includes a latch 10, an NAND gate 11 and an inverter 12. The latch 10 includes a tri-state gate 101 and a tri-state gate 102 oppositely disposed to each other, and an inverter 103 connected in parallel to the tri-state gate 102. A large number of TFTs will be used in this circuit. When shift register units having the above structure are connected in cascade to form a gate driving circuit, the structure of the gate driving circuit is shown in FIG. 2. Since each of the shift register units have a large number of TFTs, the structure of the GOA circuit becomes complicated and takes up a lot of layout space, which will be adverse to the narrow border design of the display device.

SUMMARY

Embodiments of the present disclosure provide a shift register unit, a gate driving circuit and a display device, which can simplify the gate driving circuit, thereby reducing a size of a border of the display device.

To achieve the above object, the following technical solutions are used in embodiments of the present disclosure.

In an aspect, the present disclosure provides a shift register unit, including: a latch module, and at least two levels of output control modules connected with the latch module; wherein input ends of the latch module are connected with a start signal and a clock signal respectively, an output end of the latch module is connected with input ends of the at least two levels of output control modules, and the latch module is configured to latch the start signal according to the clock signal inputted; wherein input ends of the output control modules are connected with clock signals, the output control modules are configured to output gate line driving signals according to the clock signals; and wherein all the clock signals are inputted sequentially to the latch module and each level of output control modules in accordance with a timing sequence.

Alternatively, the latch module may include: a first tri-state gate, a second tri-state gate and a first inverter; wherein an input end of the first tri-state gate is connected with the start signal, a control end of the first tri-state gate is connected with the corresponding clock signal, and an output end of the first tri-state gate is connected with an output end of the second tri-state gate; an input end of the second tri-state gate is connected with input ends of the at least two levels of output control modules, and a control end of the second tri-state gate is connected with the corresponding clock signal; an input end of the first inverter is connected with the output end of the second tri-state gate; and an output end of the first inverter is connected with the input end of the second tri-state gate.

Alternatively, the output control module may include: an NAND gate and a second inverter; wherein input ends of the NAND gate are connected with the input end of the second tri-state gate and the corresponding clock signal respectively, an output end of the NAND gate is connected with an input end of the second inverter; an output end of the second inverter outputs the gate line driving signal.

Alternatively, the output control module may include a transmission gate and a buffer; wherein an input end of the transmission gate is connected with the corresponding clock signal, a first control end of the transmission gate is connected with the output end of the second tri-state gate, a second control end of the transmission gate is connected with the input end of the second tri-state gate, and an output end of the transmission gate is connected with an input end of the buffer; an output end of the buffer outputs the gate line driving signal.

Alternatively, the buffer may include a buffer transistor and an amplifier; wherein a gate electrode of the buffer transistor is connected with the input end of the second tri-state gate, a first electrode of the buffer transistor is connected with the output end of the transmission gate, and a second electrode of the buffer transistor is connected with the ground; an input end of the amplifier is connected with the output end of the transmission gate, and a signal outputting end of the amplifier outputs the gate line driving signal.

In another aspect, the present disclosure provides a gate driving circuit, including: multi-level shift register units described above, wherein the multi-level shift register units are connected in cascade.

Alternatively, except for a first level shift register unit, an input end of the latch module in each level of shift register units may be connected with an output end of a last level output control module in a previous level shift register unit; or except for the first level shift register unit, an input end of the latch module in each level of shift register unit may be connected with an output end of the latch module in a previous level shift register unit.

Alternatively, the latch module may include a first tri-state gate, a second tri-state gate and a first inverter; wherein an input end of the first tri-state gate is connected with the start signal, a control end of the first tri-state gate is connected with the corresponding clock signal, and an output end of the first tri-state gate is connected with an output end of the second tri-state gate; an input end of the second tri-state gate is connected with input ends of at least two levels of the output control modules, and a control end of the second tri-state gate is connected with the corresponding clock signal; an input end of the first inverter is connected with the output end of the second tri-state gate; and an output end of the first inverter is connected with the input end of the second tri-state gate.

Alternatively, the output control module may include: an NAND gate and a second inverter; wherein input ends of the NAND gate are connected with the input end of the second tri-state gate and the corresponding clock signal respectively, an output end of the NAND gate is connected with an input end of the second inverter; an output end of the second inverter outputs the gate line driving signal.

Alternatively, an input end of a first tri-state gate of a latch module in a shift register unit may be connected with an output end of an NAND gate of a last level output control module in a previous level shift register unit; or an input end of a first tri-state gate of a latch module in a shift register unit may be connected with an input end of a second tri-state gate of a latch module in a previous level shift register unit.

Alternatively, the output control module may include a transmission gate and a buffer; wherein an input end of the transmission gate is connected with the corresponding clock signal, a first control end of the transmission gate is connected with the output end of the second tri-state gate, a second control end of the transmission gate is connected with the input end of the second tri-state gate, and an output end of the transmission gate is connected with an input end of the buffer; an output end of the buffer outputs the gate line driving signal.

Alternatively, the buffer may include a buffer transistor and an amplifier; wherein a gate electrode of the buffer transistor is connected with the input end of the second tri-state gate, a first electrode of the buffer transistor is connected with the output end of the transmission gate, and a second electrode of the buffer transistor is connected with the ground; an input end of the amplifier is connected with the output end of the transmission gate, and a signal outputting end of the amplifier outputs the gate line driving signal.

Alternatively, an input end of a first tri-state gate of a latch module in a shift register unit may be connected with a signal outputting end of an amplifier in a last level output control module in a previous level shift register unit; or an input end of a first tri-state gate of a latch module in a shift register unit may be connected with an input end of a second tri-state gate of a latch module in a previous level shift register unit.

Alternatively, the input end of the latch module of the first level shift register unit may be inputted with a frame start signal.

In yet another aspect, the present disclosure provides a display device, including the gate driving circuit described above.

Embodiments of the present disclosure provide a shift register unit, a gate driving circuit and a display device. The shift register unit includes a latch module, and at least two levels of output control modules connected with the latch module. Input ends of the latch module are connected with a start signal and a clock signal respectively, an output end of the latch module is connected with input ends of the at least two levels of output control modules, and the latch module is configured to latch the start signal according to the clock signal inputted. Input ends of the output control modules are connected with clock signals, the output control modules are configured to output gate line driving signals according to the clock signals. All the clock signals are inputted sequentially to the latch module and each level of output control modules in accordance with a timing sequence. As a result, one latch module of each shift register unit may be connected with multi-level output control modules. Therefore, when the shift register units are connected in cascade to form a gate driving circuit, the number of TFTs in the circuit is greatly reduced, which simplifies the structure of the GOA circuit and reduces the layout space, thereby achieving a narrow border design of the display device.

DETAILED DESCRIPTION

The technical solutions according to the embodiments of the present disclosure will be clearly and fully described hereinafter in conjunction with the accompanying drawings in the embodiments of the present disclosure. Obviously, the described embodiments are merely parts of embodiments of the present disclosure, but not all the embodiments. Based on the embodiments in the present disclosure, all the other embodiments obtained by a person skilled in the art will fall within the protection scope of the present disclosure.

Figure 1:
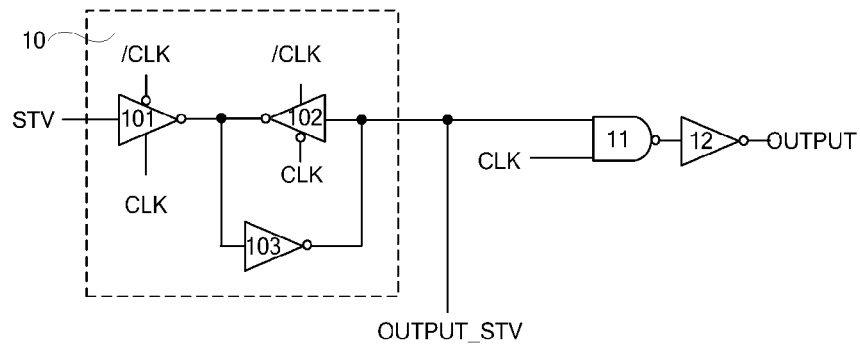
FIG. 1 is a schematic view showing a structure of a shift register unit in the related art.
Figure 2:
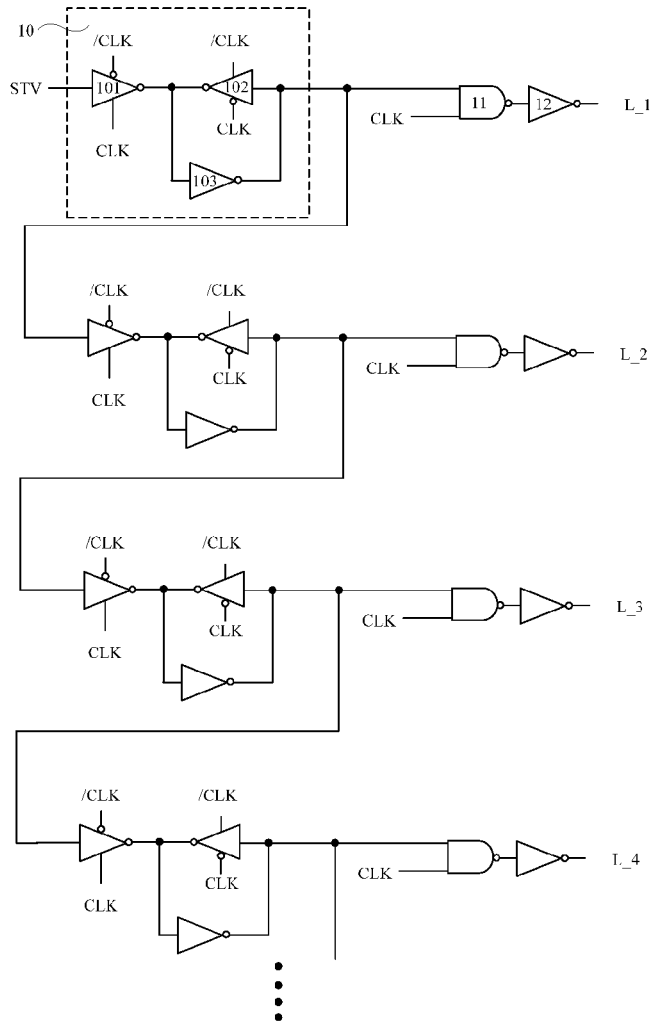
FIG. 2 is a schematic view showing a structure of a gate driving circuit in the related art.
Figure 3:
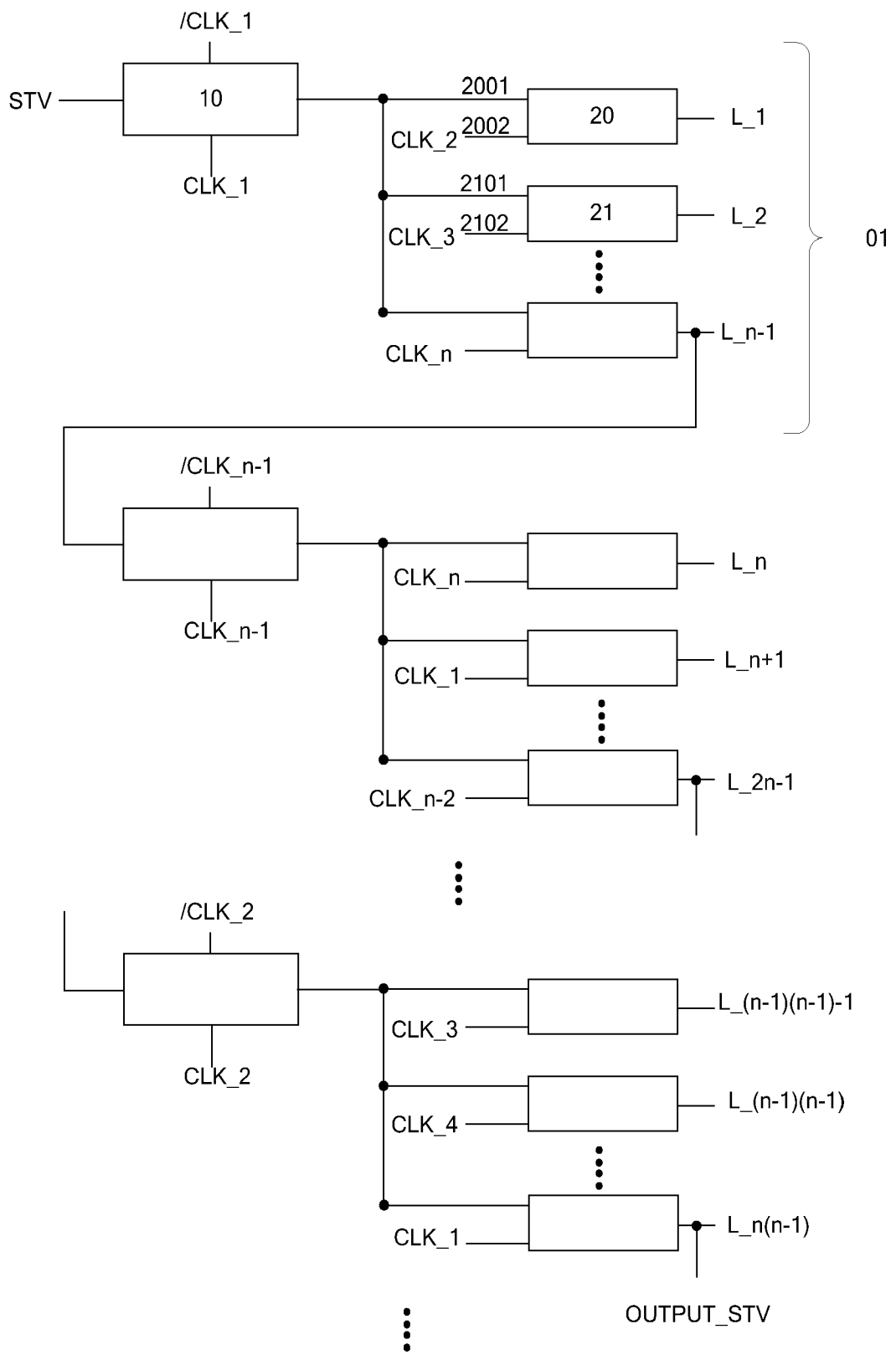
FIG. 3 is a schematic view showing a structure of a gate driving circuit according to an embodiment of the present disclosure.

In an aspect, the present disclosure provides a shift register unit, including: a latch module and at least two levels of output control modules connected with the latch module. For example, in a gate driving circuit as shown in FIG. 3, output ends of a latch module 10 of a first level shift register unit 01 is connected with input ends of multi-level output control modules such as a first level output control module 20, a second level output control module 21 and so forth, respectively.

Input ends of the latch module 10 are connected with a start signal and a clock signal (CLK) respectively. An output end of the latch module 10 is connected with input ends of the at least two levels of output control modules. The latch module is configured to latch the start signal according to the clock signal (CLK) inputted. Specifically, description will be given with an example where the output end of latch module 10 is connected with two levels of output control modules. For example, the output end of latch module 10 is connected with a first input end 2001 of a first level output control module 20 and a first input end 2101 of a second level output control module 21.

A second input end of the output control modules are connected with clock signal (CLK), and the output control modules are configured to output gate line driving signals according to the clock signal (CLK). For example, a second input end 2002 of the first level output control module 20 and a second input end 2102 of the second level output control module 21 are connected with the clock signal (CLK). According to the inputted clock signal (CLK), the output end of the first level output control module 20 outputs a first gate line driving signal (L_1), the output end of second level output control module 21 outputs a second gate line driving signal (L_2).

The above clock signals (CLKs) are inputted sequentially to the latch module and each level of output control modules in accordance with a timing sequence. For example, the clock signal which an input end of the latch module 10 is connected with is CLK_1; the clock signal inputted to the second input end 2002 of the first level output control module 20 is CLK_2; the clock signal inputted to the second input end 2102 of the second level output control module 21 is CLK_3. Waveforms of clock signals CLK_1, CLK_2 and CLK_3 are identical but timing sequence thereof are sequentially delayed.

The present disclosure provides in an embodiment a shift register unit. The shift register unit includes a latch module, and at least two levels of output control modules connected with the latch module. Input ends of the latch module are connected with a start signal and a clock signal respectively, an output end of the latch module is connected with input ends of the at least two levels of output control modules, and the latch module is configured to latch the start signal according to the clock signal inputted. Second input ends of the output control modules are connected with clock signals, the output control modules are configured to output gate line driving signals from their output ends according to the clock signals. All the clock signals are inputted sequentially to the latch module and each level of output control modules in accordance with a timing sequence. As a result, one latch module of each shift register unit may be connected with multi-level output control modules. Therefore, when the shift register units are connected in cascade to form a gate driving circuit, the number of TFTs in the circuit is greatly reduced, which simplifies the structure of the GOA circuit and reduces the layout space, thereby achieving a narrow border design of the display device.

Figure 4:
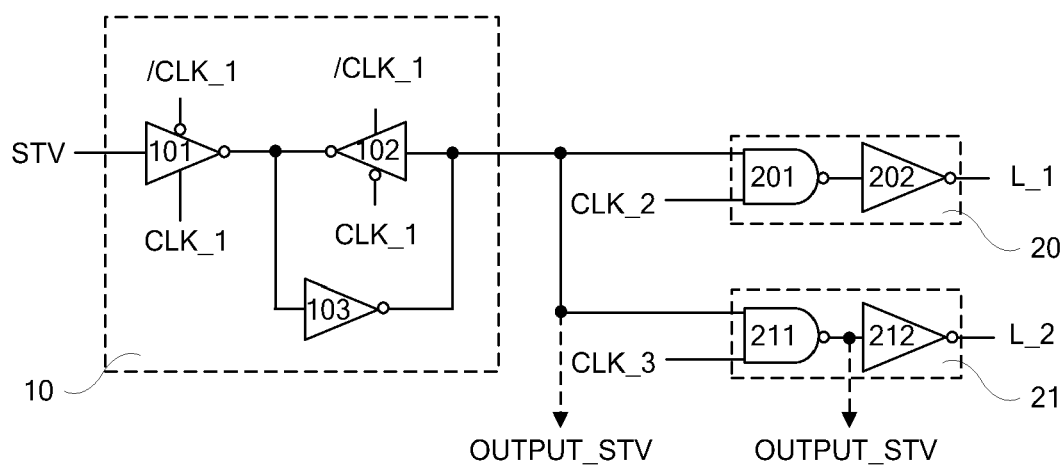
FIG. 4 is a schematic view showing a structure of a shift register unit according to an embodiment of the present disclosure.

Furthermore, as shown in FIG. 4, the latch module 10 includes a first tri-state gate 101, a second tri-state gate 102 and a first inverter 103.

An input end of the first tri-state gate 101 is connected with the start signal, a control end of the first tri-state gate 101 is connected with a first clock signal (CLK_1), and an output end of the first tri-state gate 101 is connected with an output end of the second tri-state gate 102.

An input end of the second tri-state gate 102 is connected with input ends of the at least two levels of output control modules. Specifically, description will be given with an example where the input end of the second tri-state gate 102 is connected with two levels of output control modules (the first level output control module 20 and the second level output control module 21), as shown in FIG. 4. A control end of the second tri-state gate 102 is connected with the first clock signal (CLK_1).

An input end of the first inverter 103 is connected with the output end of the second tri-state gate 102 and an output end of the first inverter 103 is connected with the input end of the second tri-state gate 102.

It should be noted that, in the shift register unit as shown in FIG. 4, description is given with the example where the latch module 10 is connected with two levels of output control modules, i.e. the first level output control module 20 and the second level output control module 21, respectively. It is obvious that the latch module 10 may be connected with more than two levels of output control modules. The connection manner of each level of the output control modules can refer to the above.

Furthermore, the output control module includes an NAND gate and a second inverter, as shown in FIG. 4. The first level output control module 20 includes a first NAND gate 201 and a second inverter 202. The second level output control module 21 includes a second NAND gate 211 and a second inverter 212.

A first input end and a second input end of the first NAND gate 201 are connected with the input end of the second tri-state gate 102 and a second clock signal (CLK_2), respectively. An output end of the first NAND gate 201 is connected with the input end of the second inverter 202 of the first level output control module 20. When there are multi-level output control modules, the connection manner between a NAND gate and a second inverter in each level of output control modules following the first level output control module 20 is similar.

An output end of the second inverter in each level of output control modules outputs a gate line driving signal for each line. For example, in FIG. 4, the output end of the second inverter 202 of the first level output control module outputs the first gate line driving signal (L_1) and the output end of the second inverter 212 of the second level output control module outputs the second gate line driving signal (L_2).

Figure 5:
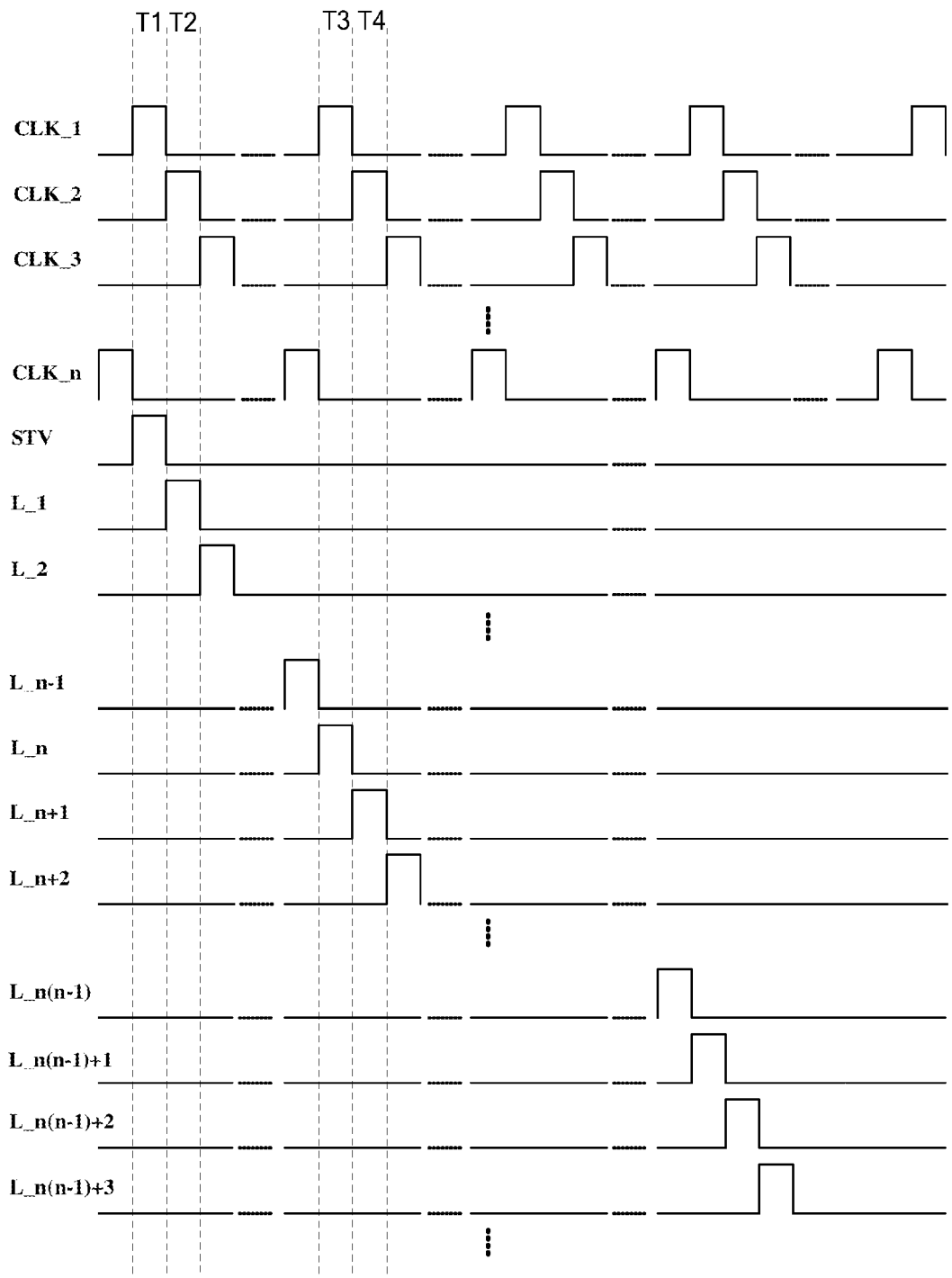
FIG. 5 is a timing diagram for a gate driving circuit according to an embodiment of the present disclosure.

Specifically, a operation process of the latch module 10 will be described in detail with the shift register unit as shown in FIG. 4 as an example and in conjunction with a timing diagram for a GOA circuit as shown in FIG. 5, where the input end of the second tri-state gate 102 is connected with two levels of output control modules i.e. the first level output control module 20 and the second level output control module 21; each level of the output control modules includes a NAND gate and a second inverter and is configured to output three clock signals (CLK_1, CLK_2, CLK_3) to the latch module and the two levels of the output control modules, respectively.

First writing stage T1: when the first clock signal (CLK_1) is of a high level, the start signal (STV) is written into the latch module 10, so that the latch module 10 outputs a high level to the first level output control module 20 and the second level output control module 21. However, at this time, the second clock signal (CLK_2) and the third clock signal (CLK_3) corresponding to the first level output control module 20 and the second level output control module 21 are of a low level. Therefore, the first gate line driving signal (L_1) and the second gate line driving signal (L_2) outputted sequentially by the two levels of the output control modules are of a low level.

First latch stage T2: the first clock signal (CLK_1) is of a low level and the high level signal written into the latch module 10 is latched. Therefore, the first level output control module 20 and the second level output control module 21 are continued to be inputted with a high level. At this time, the second clock signal (CLK_2) and the third clock signal (CLK_3) corresponding to the first level output control module 20 and the second level output control module 21 become of a high level sequentially. A high level is inputted to the first NAND gate 201 and the second NAND gate 211, respectively. Therefore, the two levels of the output control modules sequentially outputs the first gate line driving signal (L_1) and the second gate line driving signal (L_2) having a high level. Signals outputted from the second NAND gate 211 or the latch module 10 can be, as an output-start signal (OUTPUT_STV), outputted to a next level shift register unit, and then servers as a start signal of the next level shift register unit.

Second writing stage T3: when the first clock signal (CLK_1) is of a high level again, a start signal having a low level is written into the latch module 10.

Second latch stage T4: when the first clock signal (CLK_1) is of a low level, the signal which is of a low level and written into the latch module 10 is latched. Therefore, the first level output control module 20 and the second level output control module 21 are continued to be inputted with a low level. Hereafter, though the second clock signal (CLK_2) and the third clock signal (CLK_3) corresponding to the first level output control module 20 and the second level output control module 21 are of a high level, the first gate line driving signal (L_1) and the second gate line driving signal (L_2) outputted sequentially by the two levels of the output control modules maintain having a low level.

The function of a latch can be achieved by a latch module having the above structures, and the number of TFTs included in the latch module is less than the related art, which can simplify the structure of the GOA circuit.

Figure 6:
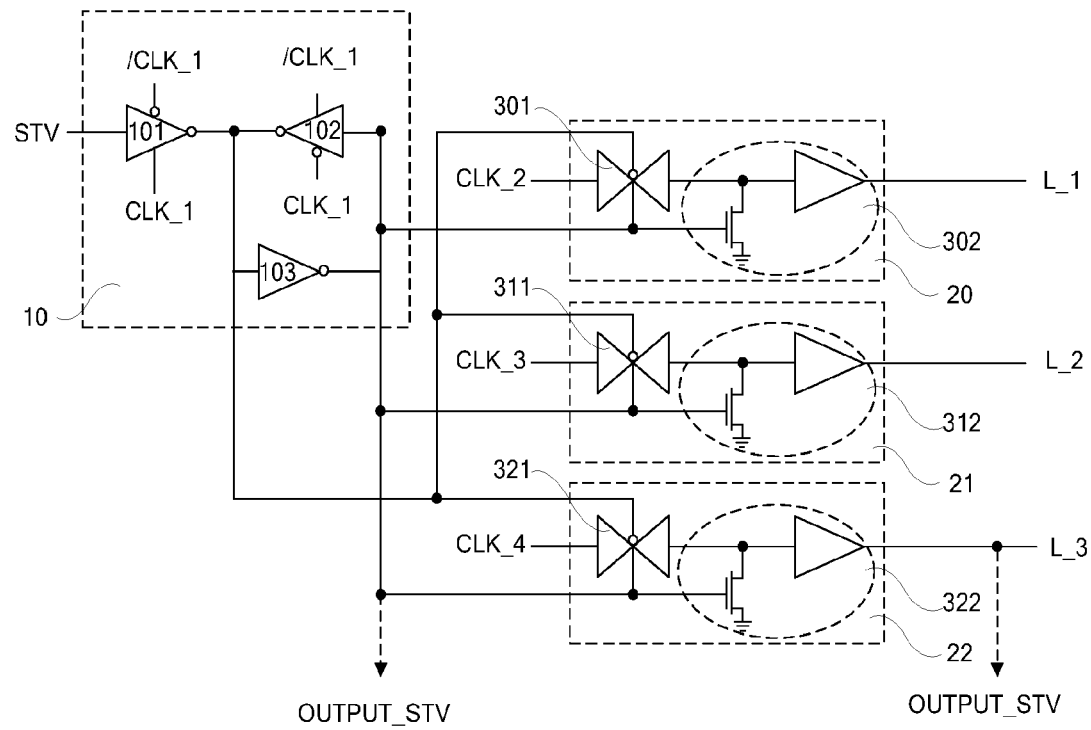
FIG. 6 is a schematic view showing a structure of a shift register unit according to another embodiment of the present disclosure.

Alternatively, the output control module may further include a transmission gate and a buffer. For example, when the output end of the latch module 10 is connected with input ends of three levels of the output control modules, as shown in FIG. 6, a first level output control module 20 includes a first transmission gate 301 and a first buffer 302; a second level output control module 21 includes a second transmission gate 311 and a second buffer 312; and a third level output control module 22 includes a third transmission gate 321 and a third buffer 322.

An input end of the transmission gate is connected with the corresponding clock signal, a first control end of the transmission gate is connected with the output end of the second tri-state gate, a second control end of the transmission gate is connected with the input end of the second tri-state gate, and an output end of the transmission gate is connected with an input end of the buffer.

Specifically, a connection relationship between the transmission gate and the buffer is described in detail with the first level output control module 20 as an example. The input end of the first transmission gate 301 is connected with the second clock signal (CLK_2), a first control end of the first transmission gate 301 is connected with the output end of the second tri-state gate 102, the second control end of the first transmission gate 301 is connected with the input end of the second tri-state gate 102, and the output end of the first transmission gate 301 is connected with the input end of the first buffer 302. The connection manner between the transmission gate and the buffer in each level of output control modules following the first level output control module 20 is similar.

An output end of the buffer in each level of output control modules outputs a gate line driving signal for each line. Specifically, as shown in FIG. 6, the output end of the first buffer 302 in the first level output control module outputs the first gate line driving signal (L_1); the output end of the second buffer 312 in the second level output control module outputs the second gate line driving signal (L_2); and the output end of the third buffer 322 in the third level output control module outputs the third gate line driving signal (L_3). Here, description is given with an example where the shift register unit, as shown in FIG. 6, includes one latch module and three levels of output control modules and outputs four clock signals (CLK_1, CLK_2, CLK_3, and CLK_4) sequentially to the gate driving circuit. When the number of output control modules in a shift register unit is changed, the number of the clock signals is changed correspondingly. The circuit structures where different numbers of clock signals are inputted to the gate driving circuit will not be described herein, but all of them fall within the scope of the present disclosure.

The output control modules can be formed by a combination of different electrical elements, which are quite common for a person skilled in the art. As a result, the manufacturing and processing for the output control modules becomes more simple, convenient and diversified, thereby reducing the difficulty of the production and improving the efficiency of the production.

Figure 7:
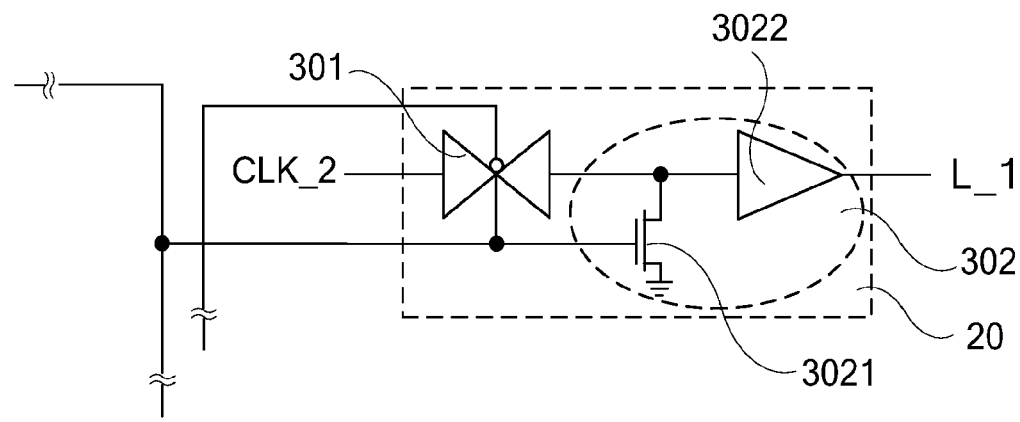
FIG. 7 is a schematic view showing a structure of an output control module according to an embodiment of the present disclosure.

Furthermore, the buffer includes a buffer transistor and an amplifier. With the first level output control module 20 based on the shift register unit as shown in FIG. 6 as an example, the first buffer 302, as shown in FIG. 7, includes a first buffer transistor 3021 and a first amplifier 3022.

A gate electrode of the first buffer transistor 3021 is connected with the input end of the second tri-state gate 102, a first electrode of the first buffer transistor 3021 is connected with the output end of the first transmission gate 301, and a second electrode of the first buffer transistor 3021 is connected with the ground.

An input end of the first amplifier 3022 is connected with the output end of the first transmission gate 301, and a signal outputting end of the first amplifier 3022 outputs the first gate line driving signal (L_1). The connection manner of each of electrical elements in the buffer in each level of output control modules can be obtained similarly.

The electrical elements constituting the buffer are quite common for a person skilled in the art. As a result, the manufacturing and processing for the buffers becomes more simple and convenient, thereby reducing the difficulty of the production and improving the efficiency of the production.

The present disclosure further provides a gate driving circuit, including any shift register units described above.

Figure 8:
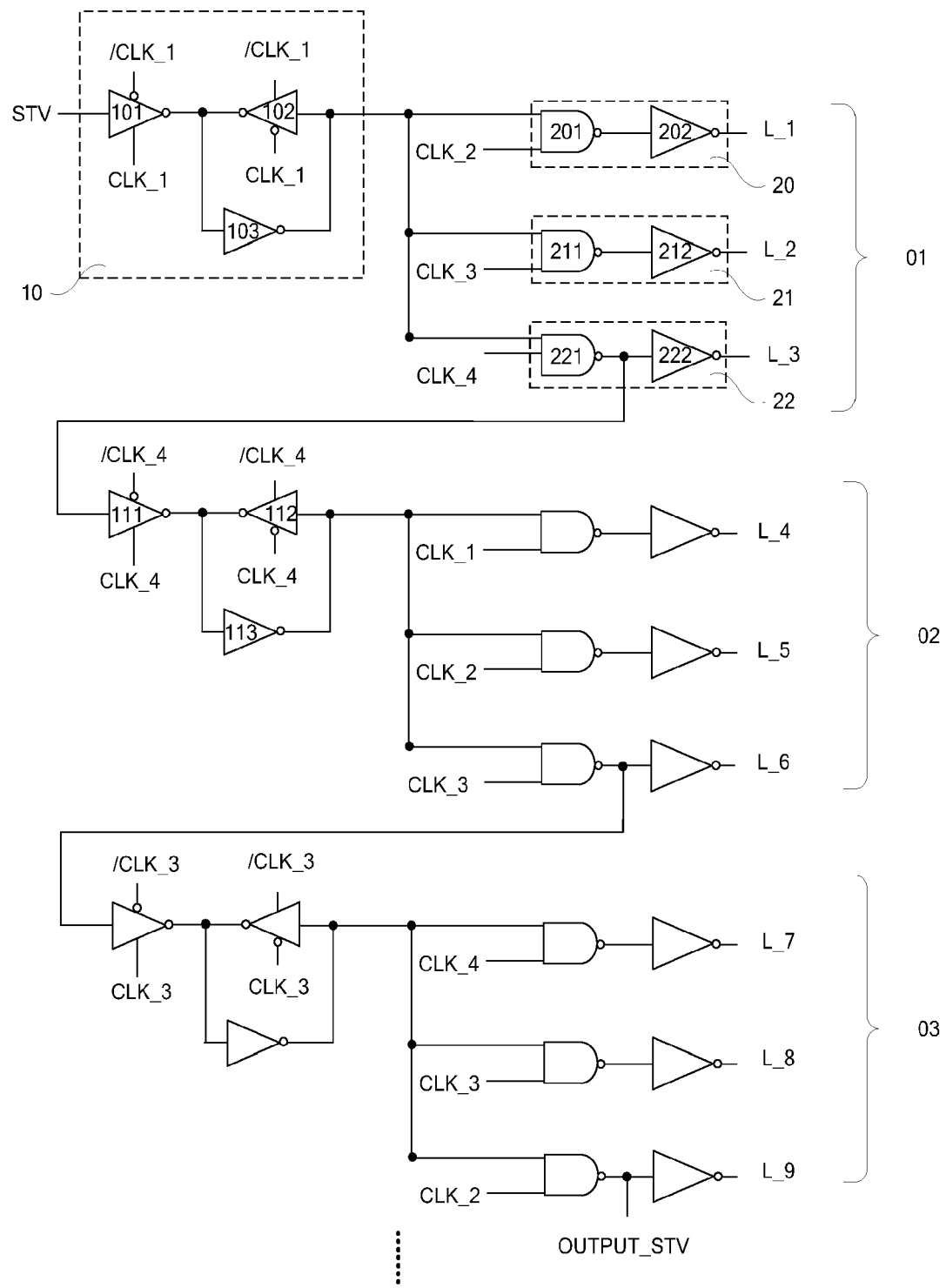
FIG. 8 is a schematic view showing a structure of a gate driving circuit according to an embodiment of the present disclosure.

As shown in FIG. 8, except for a first level shift register unit, each level of shift register units is connected with an output end of an immediately previous level shift register unit.

Except for a first level shift register unit, an output end of each level of shift register units is connected with an immediately next level shift register unit.

An embodiment of the present disclosure provides a gate driving circuit. The gate driving circuit includes multi-level shift register units.

The shift register unit includes a latch module, and at least two levels of output control modules connected with the latch module. Input ends of the latch module are connected with a start signal and a clock signal respectively, an output end of the latch module is connected with input ends of the at least two levels of output control modules, and the latch module is configured to latch the start signal according to the clock signal inputted. Second input ends of the output control modules are connected with clock signals, the output control modules are configured to output gate line driving signals from their output ends according to the clock signals. All the clock signals are inputted sequentially to the latch module and each level of output control modules in accordance with a timing sequence. As a result, one latch module of each shift register unit may be connected with multi-level output control modules. Therefore, when the shift register units are connected in cascade to form a gate driving circuit, the number of TFTs in the circuit is greatly reduced, which simplifies the structure of the GOA circuit and reduces the layout space, thereby achieving a narrow border design of the display device.

Figure 9:
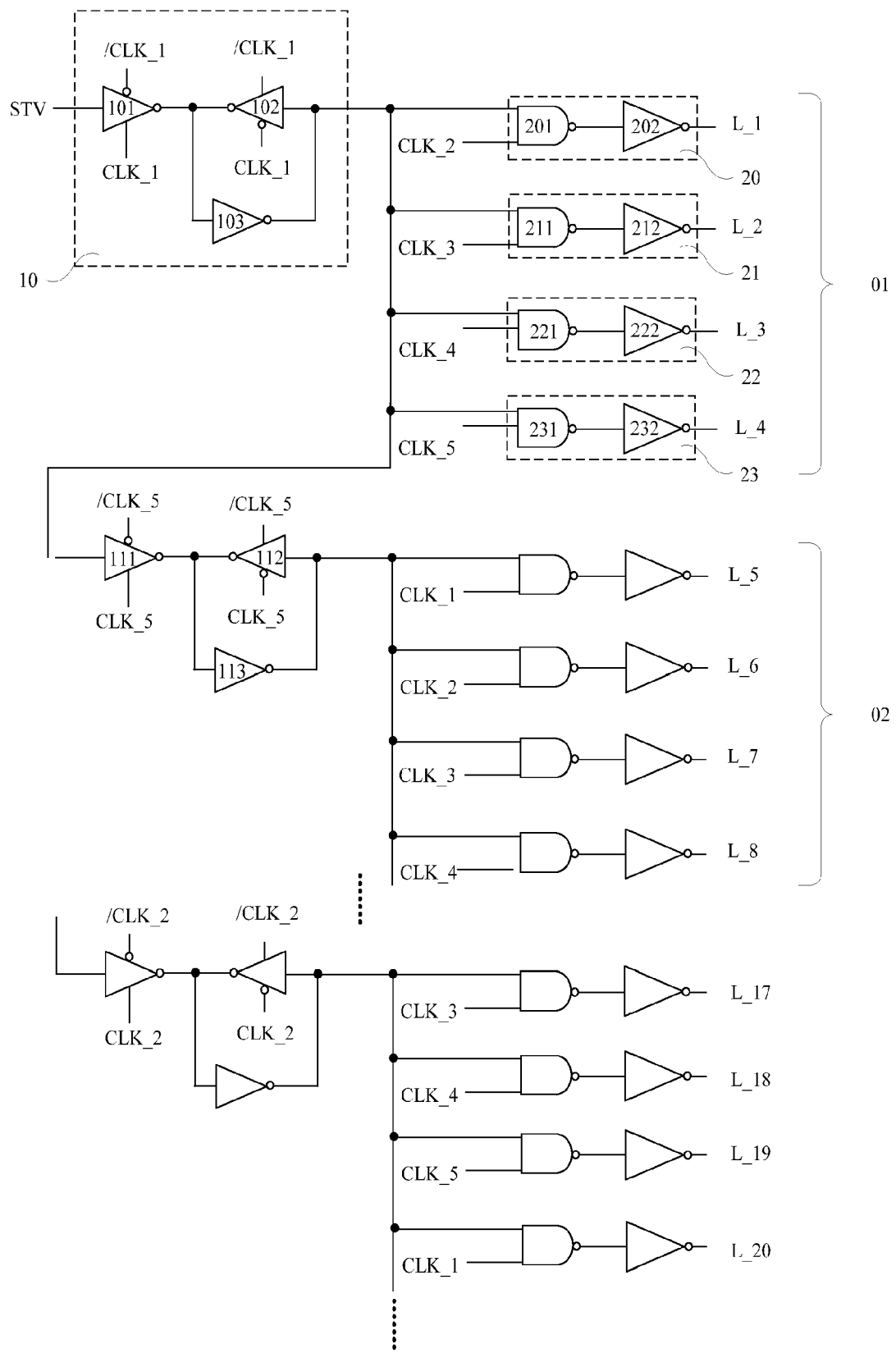
FIG. 9 is a schematic view showing a structure of a gate driving circuit according to another embodiment of the present disclosure.
Figure 10:
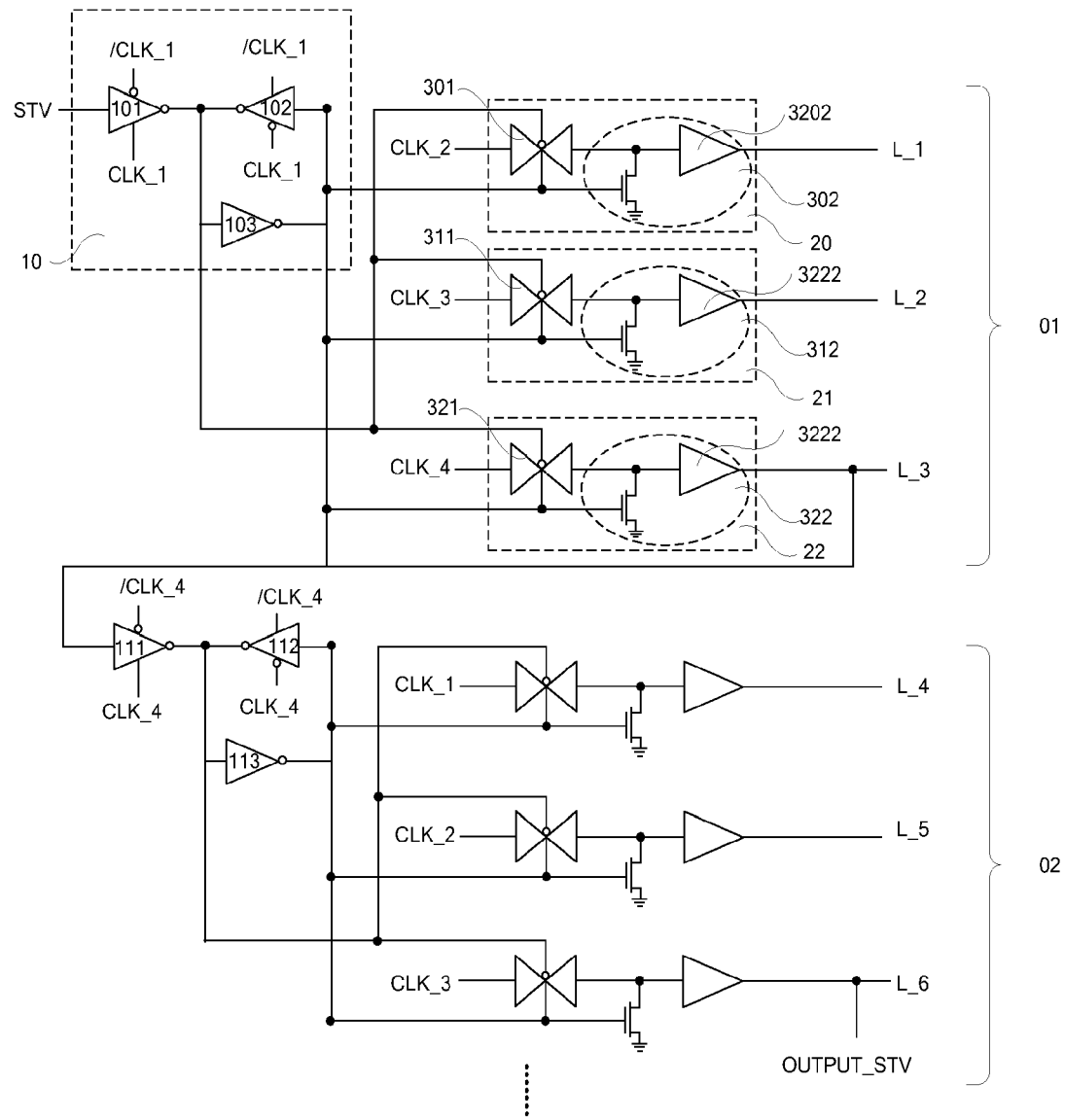
FIG. 10 is a schematic view showing a structure of a gate driving circuit according to yet another embodiment of the present disclosure.
Figure 11:
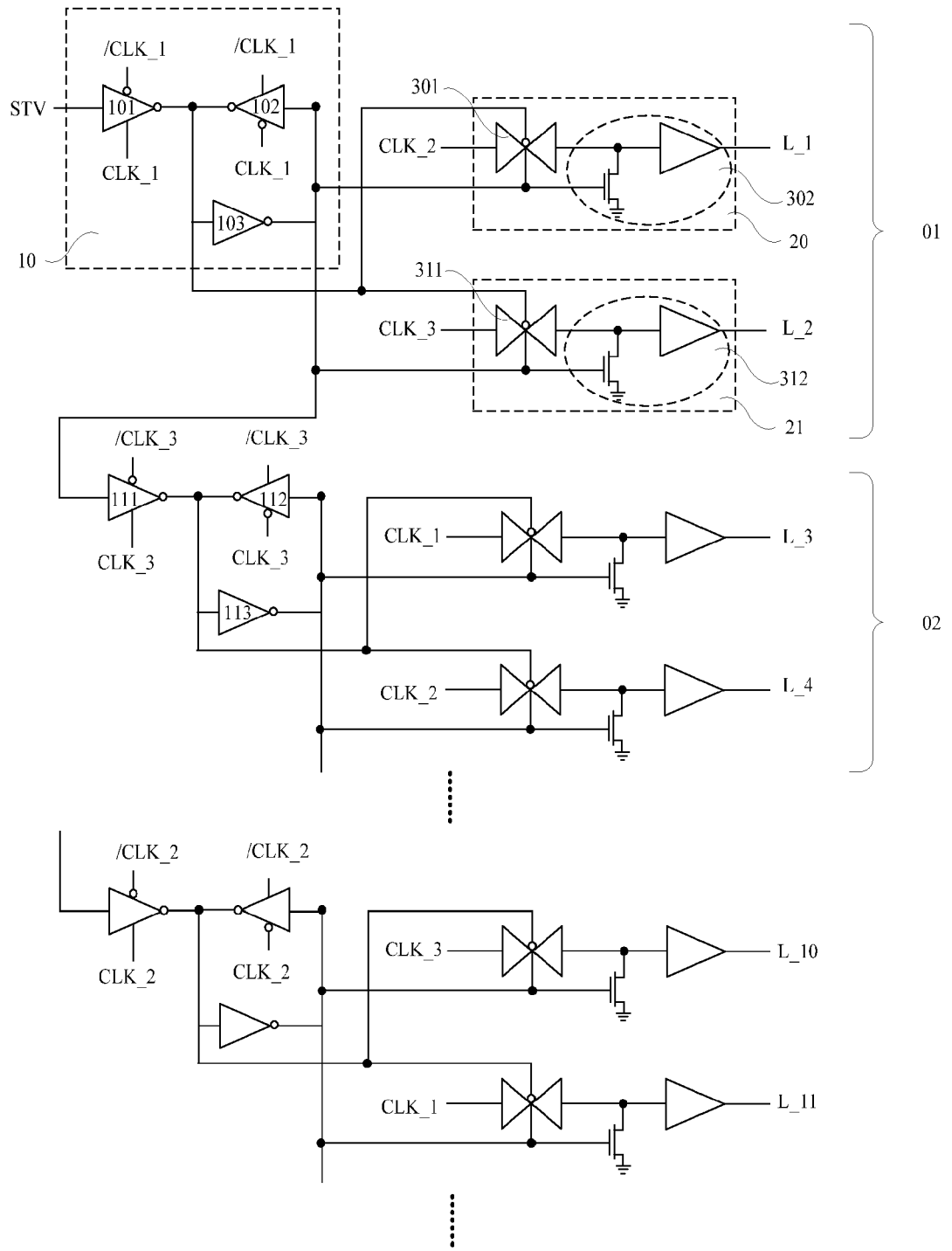
FIG. 11 is a schematic view showing a structure of a gate driving circuit according to still yet another embodiment of the present disclosure.

Furthermore, that the shift register unit is connected with a last level output control module in an immediately previous level shift register unit includes that, as shown in FIG. 8, an input end of a latch module 10 in a shift register unit is connected with an output end of an NAND gate in a last level output control module in a previous level shift register unit; or, as shown in FIG. 10, an input end of an latch module 10 of a shift register unit is connected with a signal outputting end of a last level output control module in a previous level shift register unit; or, as shown in FIG. 9 or FIG. 11, an input end of a latch module 10 in a shift register unit is connected with an output end of a latch module 10 in a previous level shift register unit.

Specifically, in the gate driving circuit, when the latch module 10 in each of shift register units includes a first tri-state gate 101, a second tri-state gate 102 and a first inverter 103; and the output control module, such as the first level output control module 20, includes an NAND gate 201 and a second inverter 202, the structure of the gate driving circuit can be as follows.

As shown in FIG. 8, an input end of a first tri-state gate 111 in a second level shift register unit 02 is connected with an output end of a last level NAND gate 221 in a previous level shift register unit (the first level shift register unit 01); or as shown in FIG. 9, an input end of a first tri-state gate 111 in a second level shift register unit 02 is connected with an input end of a second tri-state gate 102 in a previous level shift register unit (the first level shift register unit 01).

The method of connecting in cascade is used in the GOA circuits, so that a conventional GOA external control signal may be compatible and meanwhile the structure of the GOA circuit can be simplified, thereby achieving a narrow border design of the display device.

Alternatively, in the gate driving circuit, when the latch module 10 in each of shift register units includes a first tri-state gate 101, a second tri-state gate 102 and a first inverter 103; and the output control module, such as the first level output control module 20, includes a transmission gate 301; and a buffer 302 includes a buffer transistor 3021 and an amplifier 3022 as shown in FIG. 7, the structure of the gate driving circuit can be as follows.

As shown in FIG. 10, an input end of a first tri-state gate 111 in a second level shift register unit 02 is connected with a signal outputting end of a last level amplifier 3222 in a previous level shift register unit (the first level shift register unit 01); or as shown in FIG. 11, an input end of a first tri-state gate 111 in a second level shift register unit 02 is connected with an input end of a second tri-state gate 102 in a previous level shift register unit (the first level shift register unit 01).

The method of connecting in cascade is used in the GOA circuits, so that a conventional GOA external control signal may be compatible and meanwhile the structure of the GOA circuit can be simplified, thereby achieving a narrow border design of the display device.

It should be noted that, in the gate driving circuit as shown in FIG. 8 or FIG. 10, each level of the shift register units includes one latch module and three output control modules and may sequentially output four clock signals (CLK_1, CLK_2, CLK_3, and CLK_4) to the gate driving circuit to achieve the corresponding functions; while in the gate driving circuit as shown in FIG. 9, each level of the shift register units includes one latch module and four output control modules, and may sequentially output five clock signals (CLK_1, CLK_2, CLK_3, CLK_4, and CLK_5) to the gate driving circuit to achieve the corresponding functions; while in the gate driving circuit as shown in FIG. 11, each level of the shift register units includes one latch module and two output control modules, and may sequentially output three clock signals (CLK_1, CLK_2, and CLK_3). When the number of output control modules in a shift register unit is changed, the number of the clock signals is changed correspondingly. The circuit structures where different numbers of clock signals are inputted to the gate driving circuit will not be described herein, but all of them fall within the scope of the present disclosure.

Furthermore, the input end of the latch module 10 of the first level shift register unit 01 may be inputted with a frame start signal (STV).

It should be noted that, in embodiments of the present disclosure, CLK and /CLK are two clock signal having the same cycle but inverted phases to each other.

Below taking FIG. 8 as an example, an operation process of the gate driving circuit will be described in detail in conjunction with FIG. 5.

S101, when the first clock signal (CLK_1) is of a high level, the frame start signal (STV) is written into the latch module 10 of the first level shift register unit 01. The latch module 10 outputs a high level to the first level output control module 20, the second level output control module 21 and the third level output control module 22. The second clock signal (CLK_2), the third clock signal (CLK_3), and a fourth clock signal (CLK_4) inputted to the first NAND gate 201 of the first level output control module 20, the second NAND gate 211 of the second level output control module 21 and the third NAND gate 221 of the third level output control module 22, respectively, are of a low level. Therefore, the first gate line driving signal (L_1), the second gate line driving signal (L_2) and the third gate line driving signal (L_3) sequentially outputted by the respective output control modules are of a low level. Each of the gate line driving signals corresponding to each level of output control modules is of a low level.

S102, when the first clock signal (CLK_1) becomes of a low level, the high level signal written into the latch module 10 of the first level shift register unit 01 is latched so that the latch module 10 continues to output a high level to the first level output control module 20, the second level output control module 21 and the third level output control module 22. The second clock signal (CLK_2), the third clock signal (CLK_3), and a fourth clock signal (CLK_4) inputted to the first NAND gate 201 of the first level output control module 20, the second NAND gate 211 of the second level output control module 21 and the third NAND gate 221 of the third level output control module 22, respectively, are of a high level. Therefore, the first gate line driving signal (L_1), the second gate line driving signal (L_2) and the third gate line driving signal (L_3) sequentially outputted by the respective output control modules are of a high level. The signal outputted from the third NAND gate 221 serves as the frame start signal of the second level shift register unit 02. Similarly, each level of output control modules sequentially outputs each of the gate line driving signals.

S103, when first clock signal (CLK_1) becomes of a high level again, the frame start signal inputted to the first level shift register unit 01 is of a low level, the low level is written into the latch module 10 of the first level shift register unit 01. The latch module 10 outputs a low level to the first level output control module 20, the second level output control module 21 and the third level output control module 22. The second clock signal (CLK_2), the third clock signal (CLK_3), and a fourth clock signal (CLK_4) inputted to the first NAND gate 201 of the first level output control module 20, the second NAND gate 211 of the second level output control module 21 and the third NAND gate 221 of the third level output control module 22, respectively, are of a low level. Therefore, the first gate line driving signal (L_1), the second gate line driving signal (L_2) and the third gate line driving signal (L_3) sequentially outputted by the respective output control modules are of a low level. Each of the gate line driving signals corresponding to each level of output control modules is of a low level.

S104, when the first clock signal (CLK_1) becomes of a low level, the low level signal written into the latch module 10 of the first level shift register unit 01 is latched so that the latch module 10 continues to output a low level to the first level output control module 20, the second level output control module 21 and the third level output control module 22. The second clock signal (CLK_2), the third clock signal (CLK_3), and a fourth clock signal (CLK_4) inputted to the first NAND gate 201 of the first level output control module 20, the second NAND gate 211 of the second level output control module 21 and the third NAND gate 221 of the third level output control module 22, respectively, are of a low level. Therefore, the first gate line driving signal (L_1), the second gate line driving signal (L_2) and the third gate line driving signal (L_3) sequentially outputted by the respective output control modules are of a low level. Each of the gate line driving signals corresponding to each level of output control modules is of a low level.

The above description is given with an example where the gate driving circuit is formed by the shift register unit including the output control module formed by the NAND gate and the second inverter, and the gate driving circuit is inputted by four clock signals. The operation process of the gate driving circuit according to the embodiment of the present disclosure, which is inputted with different clock signals, will not be described; however, these should be considered to fall within the scope of the present disclosure.

The present disclosure further provides a display device, including the gate driving circuit described above.

Embodiments of the present disclosure provide a display device. The display device includes the gate driving circuit, which includes multi-level shift registers connected in cascade. The shift register unit includes a latch module, and at least two levels of output control modules connected with the latch module. Input ends of the latch module are connected with a start signal and a clock signal respectively, an output end of the latch module is connected with input ends of the at least two levels of output control modules, and the latch module is configured to latch the start signal according to the clock signal inputted. Input ends of the output control modules are connected with clock signals, the output control modules are configured to output gate line driving signals according to the clock signals. All the clock signals are inputted sequentially to the latch module and each level of output control modules in accordance with a timing sequence. As a result, one latch module of each shift register unit may be connected with multi-level output control modules. Therefore, when the shift register units are connected in cascade to form a gate driving circuit, the number of TFTs in the circuit is greatly reduced, which simplifies the structure of the GOA circuit and reduces the layout space, thereby achieving a narrow border design of the display device.

It can be understood by a person skilled in the art that, all or part of the steps for realizing the above embodiments can be accomplished by a program instructing relevant hardware. The aforementioned program may be stored in a computer readable storage medium. When the program is executed, the steps are executed at the same time. The aforementioned medium includes ROM, RAM, disk or CD-ROM and other medium that can store program codes therein.

The above is only preferred embodiments of the present disclosure, but the scope of the present disclosure is not limited thereto. Changes or replaces which can be easily obtained by a person skilled in the art within the technical scope of the present disclosure should fall within the protection scope of the present disclosure. Therefore, the scope of the present disclosure should be defined by the claims.

What is claimed is:

1. A shift register unit, comprising:
    a latch module; and
    at least two levels of output control modules connected with the latch module,
    wherein:
        input ends of the latch module are connected with a start signal and a clock signal respectively,
        an output end of the latch module is connected with input ends of the at least two levels of output control modules respectively,
        the latch module is configured to latch the start signal according to the clock signal inputted,
        input ends of respective output control modules among the at least two levels of the output control modules are connected with clock signals,
        the respective output control modules are configured to output corresponding gate line driving signals sequentially according to the clock signals latched,
        all the clock signals and the clock signals latched are inputted sequentially to the latch module and each level of output control modules in accordance with a timing sequence,
        the latch module comprises a first tri-state gate, a second tri-state gate, and a first inverter,
        an input end of the first tri-state gate is connected with the start signal,
        a control end of the first tri-state gate is connected with the corresponding clock signal,
        an output end of the first tri-state gate is connected with an output end of the second tri-state gate, an input end of the second tri-state gate is connected with input ends of the at least two levels of output control modules, a control end of the second tri-state gate is connected with the corresponding clock signal, an input end of the first inverter is connected with the output end of the second tri-state gate, an output end of the first inverter is connected with the input end of the second tri-state gate, each of the at least two levels of output control modules includes a transmission gate and a buffer, an input end of the transmission gate is connected with the corresponding clock signal, a first control end of the transmission gate is connected with the output end of the second tri-state gate, a second control end of the transmission gate is connected with the input end of the second tri-state gate, an output end of the transmission gate is connected with an input end of the buffer, and an output end of the buffer outputs the gate line driving signal.

2. The shift register unit according to claim 1, wherein:
the buffer comprises a buffer transistor and an amplifier,
a gate electrode of the buffer transistor is connected with the input end of the second tri-state gate, a first electrode of the buffer transistor is connected with the output end of the transmission gate, and a second electrode of the buffer transistor is connected with ground, and
an input end of the amplifier is connected with the output end of the transmission gate, and a signal outputting end of the amplifier outputs the gate line driving signal.

3. A gate driving circuit, comprising:
multi-level shift register units,
wherein:
the multi-level shift register units are connected in cascade,
each level of shift register units comprises:
a latch module, and
at least two levels of output control modules connected with the latch module,
input ends of the latch module are connected with a start signal and a clock signal respectively,
an output end of the latch module is connected with input ends of the at least two levels of output control modules respectively,
the latch module is configured to latch the start signal according to the clock signal inputted,
input ends of respective output control modules among the at least two levels of the output control modules are connected with clock signals,
the respective output control modules are configured to output corresponding gate line driving signals sequentially according to the clock signals latched,
all the clock signals and the clock signals latched are inputted sequentially to the latch module and each level of output control modules in accordance with a timing sequence,
the latch module comprises a first tri-state gate, a second tri-state gate and a first inverter,
an input end of the first tri-state gate is connected with the start signal,
a control end of the first tri-state gate is connected with the corresponding clock signal,
an output end of the first tri-state gate is connected with an output end of the second tri-state gate, an input end of the second tri-state gate is connected with input ends of the at least two levels of output control modules, a control end of the second tri-state gate is connected with the corresponding clock signal, and an input end of the first inverter is connected with the output end of the second tri-state gate, an output end of the first inverter is connected with the input end of the second tri-state gate, each of the at least two levels of output control modules includes a transmission gate and a buffer, an input end of the transmission gate is connected with the corresponding clock signal, a first control end of the transmission gate is connected with the output end of the second tri-state gate, a second control end of the transmission gate is connected with the input end of the second tri-state gate, an output end of the transmission gate is connected with an input end of the buffer, and an output end of the buffer outputs the gate line driving signal.

4. The gate driving circuit according to claim 3, wherein except for a first level shift register unit, an input end of the latch module in each level of shift register units is connected with an output end of a last level output control module in a previous level shift register unit.

5. The gate driving circuit according to claim 4, wherein the input end of the latch module of the first level shift register unit is inputted with a frame start signal.

6. The gate driving circuit according to claim 3, wherein:
the buffer comprises a buffer transistor and an amplifier,
a gate electrode of the buffer transistor is connected with the input end of the second tri-state gate, a first electrode of the buffer transistor is connected with the output end of the transmission gate, and a second electrode of the buffer transistor is connected with ground, and
an input end of the amplifier is connected with the output end of the transmission gate, and a signal outputting end of the amplifier outputs the gate line driving signal.

7. The gate driving circuit according to claim 6, wherein an input end of a first tri-state gate of a latch module in a shift register unit is connected with a signal outputting end of an amplifier in a last level output control module in a previous level shift register unit.

8. The gate driving circuit according to claim 6, wherein an input end of a first tri-state gate of a latch module in a shift register unit is connected with an input end of a second tri-state gate of a latch module in a previous level shift register unit.

9. The gate driving circuit according to claim 3, wherein an input end of the latch module of a first level shift register unit is inputted with a frame start signal.

10. The gate driving circuit according to claim 3, wherein except for a first level shift register unit, an input end of the latch module in each level of shift register unit is connected with an output end of the latch module in a previous level shift register unit.

11. The gate driving circuit according to claim 10, wherein the input end of the latch module of the first level shift register unit is inputted with a frame start signal.

12. A display device, comprising a gate driving circuit, wherein:
the gate driving circuit comprises multi-level shift register units,
the multi-level shift register units are connected in cascade, each level of shift register units comprises:
- a latch module, and
- at least two levels of output control modules connected with the latch module, input ends of the latch module are connected with a start signal and a clock signal respectively, an output end of the latch module is connected with input ends of the at least two levels of output control modules respectively, the latch module is configured to latch the start signal according to the clock signal inputted, input ends of respective output control modules among the at least two levels of the output control modules are connected with clock signals, the respective output control modules are configured to output corresponding gate line driving signals sequentially according to the clock signals latched, all the clock signals and the clock signals latched are inputted sequentially to the latch module and each level of output control modules in accordance with a timing sequence, the latch module comprises a first tri-state gate, a second tri-state gate and a first inverter, an input end of the first tri-state gate is connected with the start signal, a control end of the first tri-state gate is connected with the corresponding clock signal, an output end of the first tri-state gate is connected with an output end of the second tri-state gate, an input end of the second tri-state gate is connected with input ends of the at least two levels of output control modules, a control end of the second tri-state gate is connected with the corresponding clock signal, an input end of the first inverter is connected with the output end of the second tri-state gate, an output end of the first inverter is connected with the input end of the second tri-state gate, each of the at least two levels of output control modules includes a transmission gate and a buffer, an input end of the transmission gate is connected with the corresponding clock signal, a first control end of the transmission gate is connected with the output end of the second tri-state gate, a second control end of the transmission gate is connected with the input end of the second tri-state gate, an output end of the transmission gate is connected with an input end of the buffer, and an output end of the buffer outputs the gate line driving signal.

* * * * *